(12) United States Patent
Lee et al.

(10) Patent No.: US 8,791,520 B2
(45) Date of Patent: Jul. 29, 2014

(54) NON-VOLATILE MEMORY DEVICES HAVING A FLOATING GATE CAP BETWEEN A FLOATING GATE AND A GATE INSULATING LAYER

(75) Inventors: Jaeduk Lee, Seongnam-si (KR); Albert Fayrushin, Suwon-si (KR); ByungKyu Cho, Seoul (KR); Jungdal Choi, Hwaseong-si (KR); Sunghoi Hur, Seoul (KR); Kwang Soo Seol, Yongin-si (KR); Dohyun Lee, Incheon (KR)

(73) Assignee: Samsung Electronics Co., Ltd. (KR)

( * ) Notice: Subject to any disclaimer, the term of this patent is extended or adjusted under 35 U.S.C. 154(b) by 225 days.

(21) Appl. No.: 12/986,553

(22) Filed: Jan. 7, 2011

(65) Prior Publication Data
US 2011/0169068 A1 Jul. 14, 2011

(30) Foreign Application Priority Data
Jan. 8, 2010 (KR) .................. 10-2010-0001757

(51) Int. Cl.
*H01L 29/788* (2006.01)
*H01L 29/792* (2006.01)

(52) U.S. Cl.
USPC ........... 257/316; 257/314; 257/315; 257/321; 257/324; 257/E29.3; 257/E29.309

(58) Field of Classification Search
USPC ....... 257/314–316, 321, 324, E29.3, E29.309
See application file for complete search history.

(56) References Cited

U.S. PATENT DOCUMENTS

| 7,915,124 B2 * | 3/2011 | Kai et al. .................. 438/261 |
| 2004/0166634 A1 | 8/2004 | Lee et al. |
| 2008/0296655 A1 | 12/2008 | Lin et al. |
| 2011/0053339 A1 * | 3/2011 | Ozawa .................. 438/424 |

FOREIGN PATENT DOCUMENTS

| JP | 2008-277694 | 11/2008 |
| JP | 2008-300427 | 12/2008 |

OTHER PUBLICATIONS

Translation of JP 2008-277694.*

* cited by examiner

*Primary Examiner* — Allison P Bernstein
(74) *Attorney, Agent, or Firm* — Myers Bigel Sibley & Sajovec, PA

(57) ABSTRACT

Provided are nonvolatile memory devices and a method of forming the same. A tunnel insulating pattern is provided on a substrate, and a floating gate is provided on the tunnel insulating pattern. A floating gate cap having a charge trap site is provided on the floating gate, and a gate dielectric pattern is provided on the floating gate cap. A control gate is provided on the gate dielectric pattern.

6 Claims, 25 Drawing Sheets

NON-VOLATILE MEMORY DEVICES HAVING A FLOATING GATE CAP BETWEEN A FLOATING GATE AND A GATE INSULATING LAYER

CROSS-REFERENCE TO RELATED APPLICATIONS

This U.S. non-provisional patent application claims priority under 35 U.S.C. §119 to Korean Patent Application No. 10-2010-0001757, filed on Jan. 8, 2010, the entire contents of which are hereby incorporated by reference.

BACKGROUND

The present disclosure relates to semiconductor memory devices and methods of forming the same, and, more particularly, to nonvolatile memory devices with a floating gate and methods of forming the same.

Non-volatile semiconductor memory devices generally retain their stored data even when their outside power supplies are interrupted. A flash memory device with a floating gate is a typical example of a nonvolatile memory device. A flash memory device is typically a highly integrated device, which may include a combination of advantages, such as those provided in an erasable programmable read-only memory (EPROM) and an electrically erasable programmable read only memory (EEPROM). A flash memory device may be classified as a NOR flash memory or a NAND flash memory. A flash memory device may store data of logic "0" or logic "1" by injecting or discharging charges into or from the floating gate.

SUMMARY

The present disclosure provides a nonvolatile memory device capable of reducing leakage current due to charge leaking into a gate dielectric pattern caused by the concentration of electric field at the top of floating gate, and methods of manufacturing the same.

Embodiments of the inventive concept provide non-volatile memory devices, including a tunnel insulating pattern disposed on a substrate, a floating gate formed on the tunnel insulating pattern, a floating gate cap disposed on the floating gate with a charge trap site, a gate dielectric pattern disposed on the floating gate cap and a control gate disposed on the gate dielectric pattern.

In some embodiments, the floating gate cap may include at least one of SiN, AlO, HfO, HfAlO and TaO.

In other embodiments, on a cross-section of the floating gate cap taken along a channel width direction a height of center portion is higher than a height of edge portion thereof. The cross-section of the floating gate cap taken along a channel width direction may have a rounded shape of a top corner.

In still other embodiments, the cross-section of the floating gate cap taken along a channel width direction may have a rounded shape of a top corner.

In even other embodiments, the gate dielectric layer on a top surface of the floating gate cap may be thicker than gate dielectric layer on sidewalls of the floating gate.

In yet other embodiments, the control gate may extend in a cross-direction of a channel length.

In further embodiments, the floating gate cap may include a charge trap layer and a silicon oxide layer.

In still further embodiments, the gate dielectric layer may include a silicon oxide layer and a silicon nitride layer.

In even further embodiments, a width of the floating gate cap in a channel width direction may be less than a width of the floating gate.

In other embodiments of the inventive concept, methods for forming non-volatile memory devices may include forming a floating gate on a substrate, forming a floating gate cap with a charge trap site on the floating gate, forming a gate dielectric layer on the floating gate cap, and forming a control gate on gate dielectric layer.

In some embodiments of the inventive concept, the forming of a floating gate cap may include forming a floating gate cap layer and patterning the floating gate cap layer on the floating gate.

In other embodiments of the inventive concept, rounding of a top portion of the floating gate cap may be included, and the rounding of the top portion of the floating gate cap may be performed with thermal processing or wet etching.

In still other embodiments of the inventive concept, the rounding of a top portion of the floating gate cap may include forming a device isolation layer on the floating gate cap and the substrate, planarizing the device isolation layer until the top portion of the floating gate cap is exposed, and thermal processing or wet etching the exposed top portion of the floating gate cap.

In even other embodiments of the inventive concept, the floating gate cap may be formed of a material comprising at least one of SiN, AlO, HfO, HfAlO and TaO.

In yet other embodiments of the inventive concept, rounding of the top portion of the floating gate may be included. The rounding of the top portion of the floating gate may include forming a device isolation layer on the floating gate and the substrate, planarizing the device isolation layer until the top portion of the floating gate is exposed, and thermal processing or wet etching the exposed top portion of the floating gate.

In further embodiments of the inventive concept, forming of the floating gate cap may include forming a floating gate cap layer on the rounded top portion of the floating gate and the device isolation layer and patterning the floating gate cap layer and the device isolation layer.

In still further embodiments of the inventive concept, forming of a spacer on sidewalls of the floating gate may be included.

In even further embodiments of the inventive concept, forming of the gate dielectric layer may include forming the gate dielectric layer on the top portion of the floating gate cap thicker than the gate dielectric layer on the sidewalls of the floating gate.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
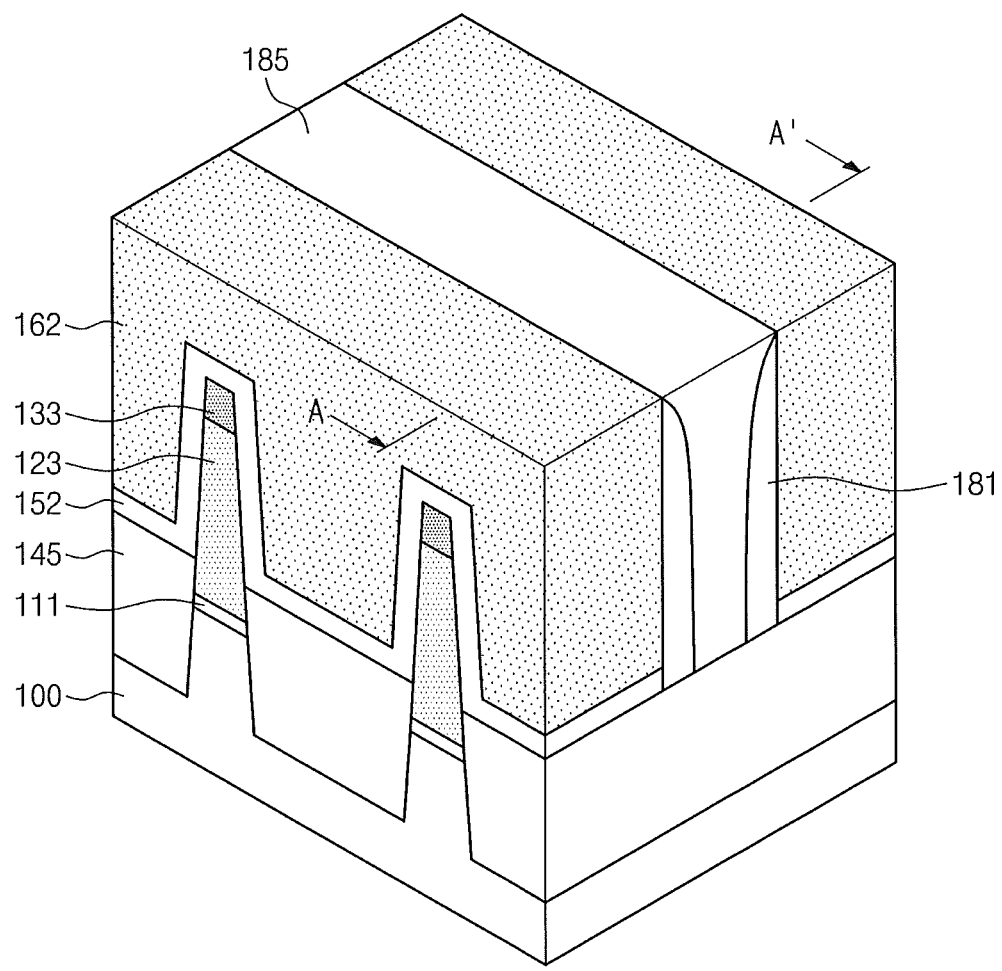
FIGS. 1 and 2 are perspective and sectional views illustrating a non-volatile memory device according to a first embodiment of the inventive concept.

Advantages and characteristics of the inventive concept, and implementable representations thereof will be clearly understood with exemplary embodiments that are described below in more detail with reference to the accompanying drawings. However, the inventive concept may be embodied in different forms and should not be construed as limited to the embodiments set forth herein. Rather, these embodiments are provided so that this disclosure will be thorough and complete, and will fully convey the scope of the inventive concept to those skilled in the art. The inventive concept may be merely defined with the scope of claims. Like reference numerals refer to like elements throughout the description.

It will also be understood herein that when a layer such as a conductive layer, a semiconductor layer or an insulating layer is referred to as being "on" another layer or substrate, the layer may be directly on the another layer or substrate, or intervening layers may also be present. It will also be understood that, although the terms such as a first, a second, a third, etc. may be used herein to describe layers or processes, the layers or processes should not be limited by these terms. These terms are only used to distinguish one layer or process from another layer or process.

All terms used herein are to describe the inventive concept that should not be limited by these terms. As used herein, the singular forms are intended to include the plural forms as well, unless the context clearly indicates otherwise. It also will be understood that, as used herein, the term "comprises" and/or "comprising" is open-ended, and includes one or more stated constituents, steps, actions and/or elements without precluding one or more unstated constituents, steps, actions and/or elements.

Furthermore, embodiments in the detailed description will be described with sectional views and/or plan views as ideal exemplary views of the inventive concept. In the drawings, the dimensions of layers and regions are exaggerated for clarity of illustration. Thus, the exemplary views may be modified according to manufacturing technology and/or allowable error. Therefore, the embodiments of the present invention are not limited to the specific shape illustrated in the exemplary views, but may include other shapes that may be created according to manufacturing processes. For example, an etched region described with right angles may be rounded or be configured with a predetermined curvature. Thus, the regions illustrated in figures are schematic, and shapes of the regions illustrated in figures exemplifies particular shapes of device regions, but do not limit the scope of the inventive concept.

Hereinafter, nonvolatile memory devices and a method of manufacturing the same according to embodiments of the inventive concept will be described in detail with reference to the accompanying drawings.

Figure 2:
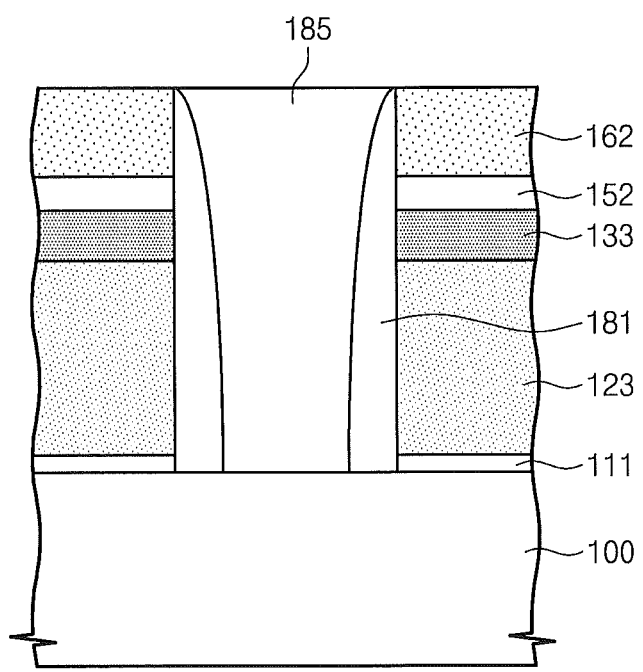

FIGS. 1 and 2 are figures illustrating a non-volatile memory device according to a first embodiment of the inventive concept. FIG. 2 is a sectional view taken along line A-A' of FIG. 1.

Referring to FIGS. 1 and 2, a substrate 100 is provided, in which an active region is defined by device isolation layers 145. The substrate 100 may be a bulk silicon substrate, a silicon on insulator (SOI) substrate, a germanium substrate, a germanium on insulator (GOI) substrate, a silicon-germanium substrate or an epitaxial thin-film substrate, which is obtained by performing a selective epitaxial growth.

The device isolation layer 145 has a line-shaped planar structure, and may be an insulation layer buried in a trench disposed in the substrate 100. The device isolation layers 145 are spaced a predetermined distance apart, parallel to each other and may define an active region in a line pattern. Furthermore, the device isolation layers 145 may protrude from a surface of the substrate 100.

A gate structure may be provided on the substrate 100 on which the active region is defined. The gate structure may include a tunnel insulating pattern 111, a floating gate 123, a gate dielectric pattern 152 and control gates 162, which are all stacked on the substrate 100 in sequence. The tunnel insulating pattern 111 may be provided on the active region surface of the substrate 100. The floating gate 123 may be provided at an intersection portion of the active region and the control gates 162. The gate dielectric pattern 152 and the control gates 162 may be disposed to cross the active region over the floating gate 123. That is, the control gates 162 may extend across a channel length direction. While non-volatile memory devices program or erase data, charges are tunneled through the tunnel insulating pattern 111 by Fowler-Nordheim (F-N) tunneling to move into the substrate 100 or the floating gate 123. The control gates 162 may be disposed in parallel to each other, which are spaced apart by an insulating layer 185. A spacer 181 may be provided on sidewalls of the control gates 162.

The gate dielectric pattern 152 may insulate between the floating gate 123 and the control gates 162. The gate dielectric pattern 152 may be formed of a dielectric layer with a high dielectric constant. For example, the gate dielectric pattern 152 may have a stacked structure of a lower oxide layer/a nitride layer/an upper oxide layer so as to increase the dielectric constant. The lower and upper oxide layers may be formed of metal oxides, such as $Al_2O_3$, $HfO_2$, $ZrO_2$, $La_2O_3$, $Ta_2O_3$, $TiO_2$ $SrTiO_3$ (STO) or (Ba, Sr)$TiO_3$ (BST). The nitride layer may be a silicon nitride layer ($Si_xN_y$, where x and y are positive integers).

A floating gate cap 133 may be provided between the floating gate 123 and the gate dielectric pattern 152. A lower surface of the floating gate cap 133 may contact an upper surface of the floating gate 123. The floating gate cap 133 may include a layer with a charge trap site. For example, the floating gate cap 133 may include at least one of SiN, AlO, HfO, HfAlO and TaO. The floating gate cap 133 may include a charge trap site with density of $10^{18}/cm^3$ to $10^{19}/cm^3$. The floating gate cap 133 may include a material with a large band gap. The floating gate cap 133 may include a plurality of layers. For example, the floating gate cap 133 may include a charge trap layer and a silicon oxide layer. A width of the floating gate cap 133 in a channel width direction may be less than that of the floating gate 123.

Recently, according to a decrease in design rule, the upper surface of the floating gate tends to be narrower. Thus, an electric field caused by the control gate concentrates on the upper surface of the floating gate 123, increasing leakage current, which results from charge leaking into the gate dielectric pattern 152. Non-volatile memory devices according to the first embodiment of the inventive concept may reduce the phenomenon of electric field concentration on the upper surface of the floating gate 123 because a floating gate cap 133 with a charge trap site is provided. That is, charges may be stored into or removed from the floating gate cap 133 with a charge trap site together with the floating gate 123. Charges trapped in the floating gate cap 133, compared to charges stored in the floating gate 123, are localized charges which are not easy to move. Thus, charges trapped in the floating gate cap 133 are less likely to be leaked into the gate dielectric pattern 152. Furthermore, an upper portion of the floating gate 123 may be spaced apart from the control gates 162 by the floating gate cap 133 to thereby reduce leakage current. Charges stored into the gate dielectric pattern 152 may be decreased because the leakage current into the gate dielectric pattern 152 is decreased by the floating gate cap 133. Thus, endurance may be improved.

FIGS. 3 to 8 are perspective views illustrating a method of manufacturing a non-volatile memory device according to the first embodiment of the inventive concept.

Figure 3:
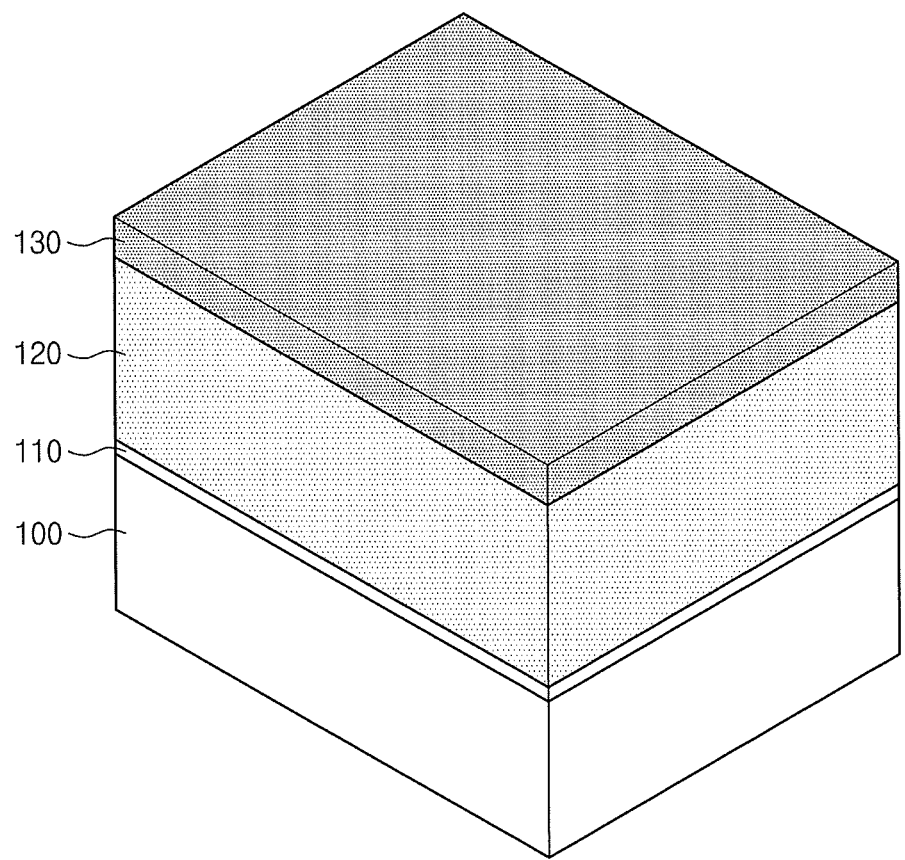
FIGS. 3 to 8 are perspective views illustrating a method of manufacturing the non-volatile memory device according to the first embodiment of the inventive concept.

Referring to FIG. 3, a tunnel insulating layer 110 may be formed on the substrate 100. The substrate 100 may be a bulk silicon substrate, a silicon on insulator (SOI) substrate, a germanium substrate, a germanium on insulator (GOI) substrate, a silicon-germanium substrate or an epitaxial thin-film substrate, which is obtained by performing a selective epitaxial growth. The tunnel insulating layer 110 may be a silicon oxide layer, which is formed by a thermal oxidation process. The tunnel insulating layer 110 may be formed of high dielectric materials, such as $Al_2O_3$, $HfO_2$, $ZrO_2$, $La_2O_3$, $Ta_2O_3$, $TiO_2$, $SrTiO_3$ (STO) or (Ba, Sr)$TiO_3$ (BST) or a combination thereof. The tunnel insulating layer 110 may be formed by chemical vapor deposition (CVD) or atomic layer deposition (ALD). A first conducive layer 120 may be formed on the tunnel insulating layer 110. The first conducive layer 120 may be an impurity-doped polysilicon layer. The first conducive layer 120 may be formed by CVD.

A floating gate cap layer 130 may be formed on the first conducive layer 120. The floating gate cap layer 130 may include a layer having a charge trap site. For example, the floating gate cap layer 130 may include at least one of SiN, AlO, HfO, HfAlO and TaO. The floating gate cap layer 130 may include materials with a large band gap. The floating gate cap 130 may include a plurality of layers. For example, the floating gate cap 130 may include a charge trap layer and a silicon oxide layer. The floating gate cap 130 may be formed by CVD or ALD.

Figure 4:
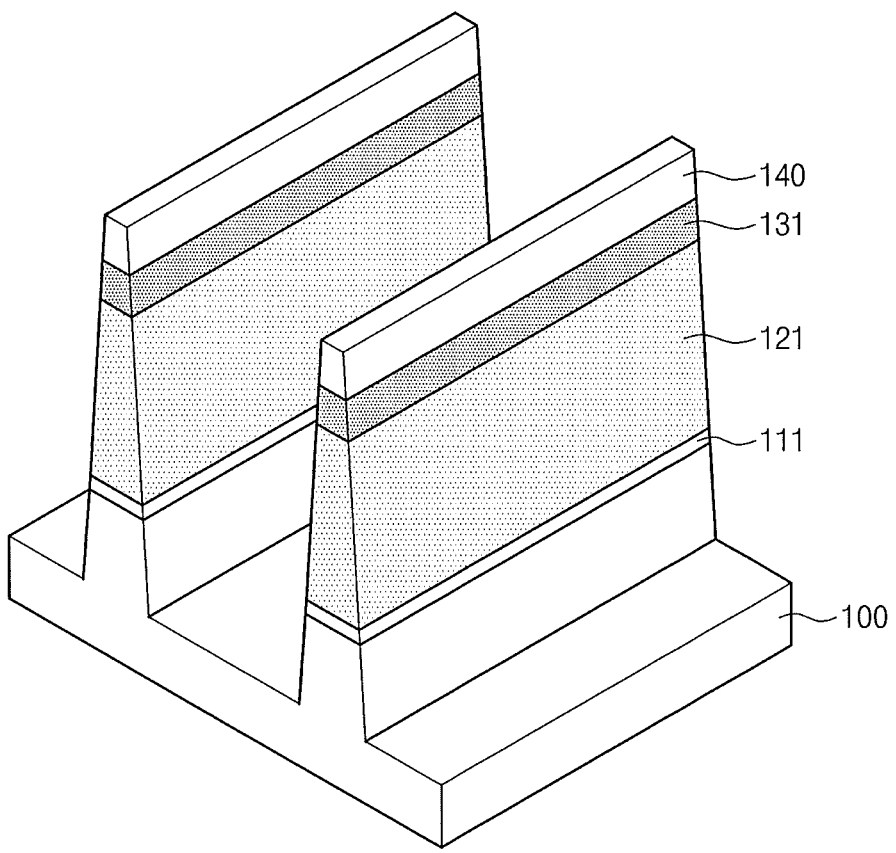

Referring to FIG. 4, the substrate 100, the tunnel insulating layer 110, the first conducive layer 120 and the floating gate cap 130 are patterned. By the patterning, a tunnel insulating pattern 111, a preliminary floating gate 121 and a preliminary floating gate cap 131 may be formed. The patterning may be performed, using a mask pattern 140 as an etch mask.

Figure 5:
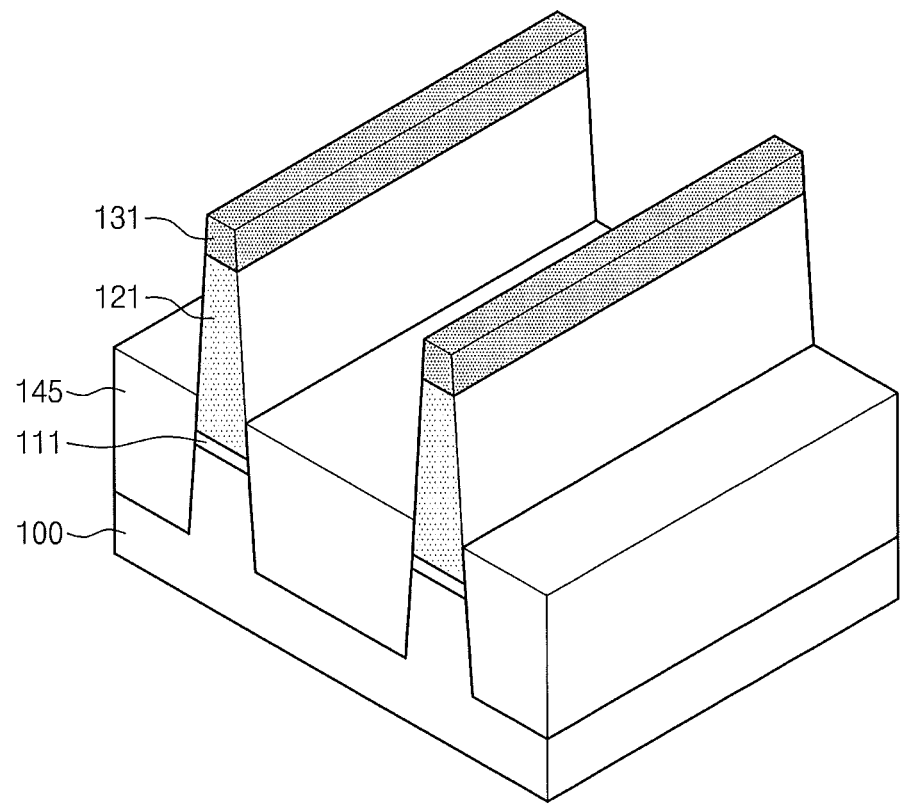

Referring to FIG. 5, device isolation layers 145 may be formed in a recess region by the patterning. The device isolation layers 145 may define an active region. The device isolation layers 145 may be an undoped silicate glass (USG) oxide layer, a tetra-ethyl-ortho-silicate (TEOS) oxide layer or a high-density plasma (HDP) oxide layer. The device isolation layers 145 may be formed in such a way that an insulating layer (not shown) is conformally formed on the substrate 100 and then the insulating layer is planarized until the preliminary floating gate cap 131 is exposed. Thereafter, the device isolation layers 145 may be etched so as to partially expose sidewalls of the preliminary floating gate 121.

Figure 6:
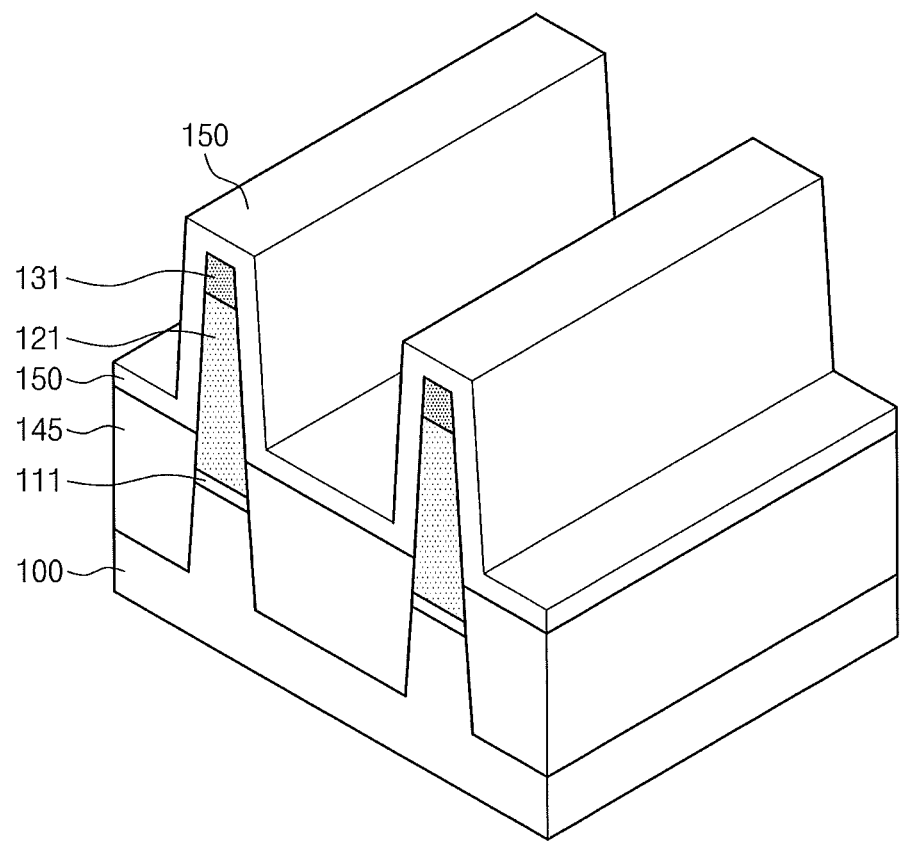

Referring to FIG. 6, a gate dielectric layer 150 may be formed on the device isolation layers 145, the preliminary floating gate 121 and the preliminary floating gate cap 131. The gate dielectric layer 150 may be formed of thermal oxides. The gate dielectric layer 150 may be formed of high dielectric materials such as $Al_2O_3$, $HfO_2$, $ZrO_2$, $La_2O_3$, $Ta_2O_3$, $TiO_2$, $SrTiO_3$ (STO) or (Ba, Sr)$TiO_3$ (BST) or a combination thereof. Furthermore, the gate dielectric layer 150 may be formed by stacking a silicon oxide layer, a silicon nitride layer and a silicon oxide layer in sequence.

Figure 7:
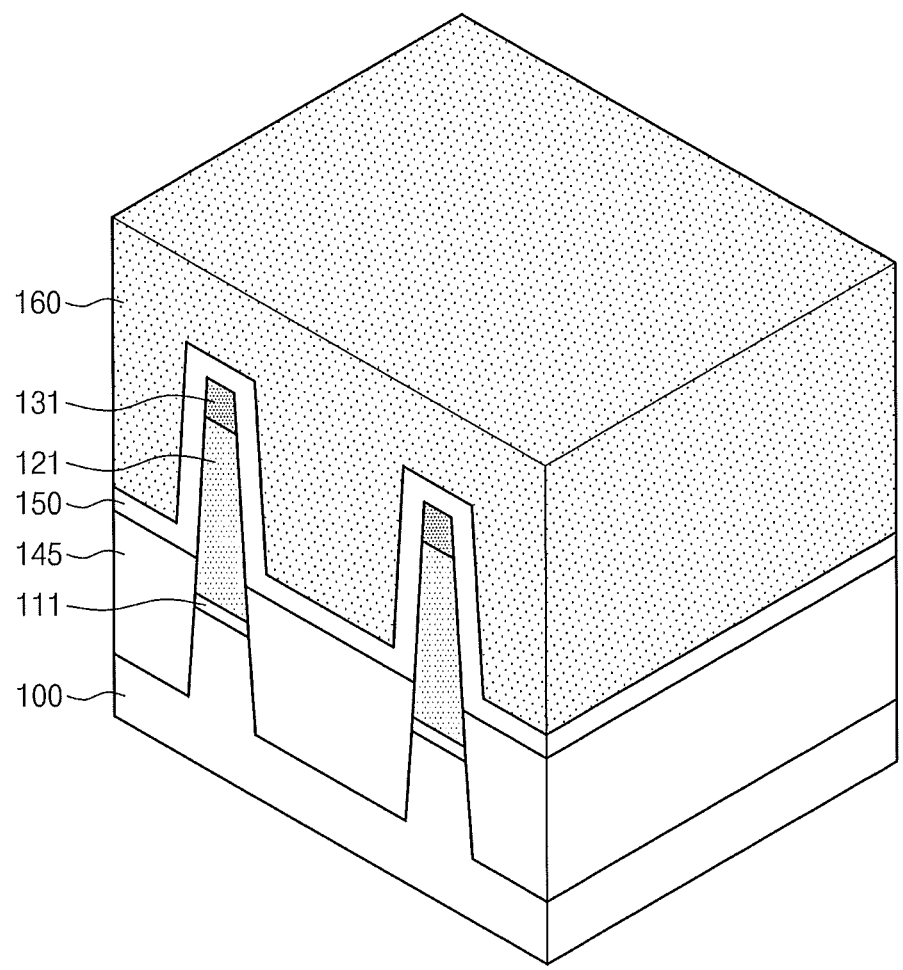

Referring to FIG. 7, a second conducive layer 160 may be formed on the gate dielectric layer 150. The second conducive layer 160 may be formed by depositing a doped polysilicon layer or a doped polycide layer on the gate dielectric layer 150.

Figure 8:
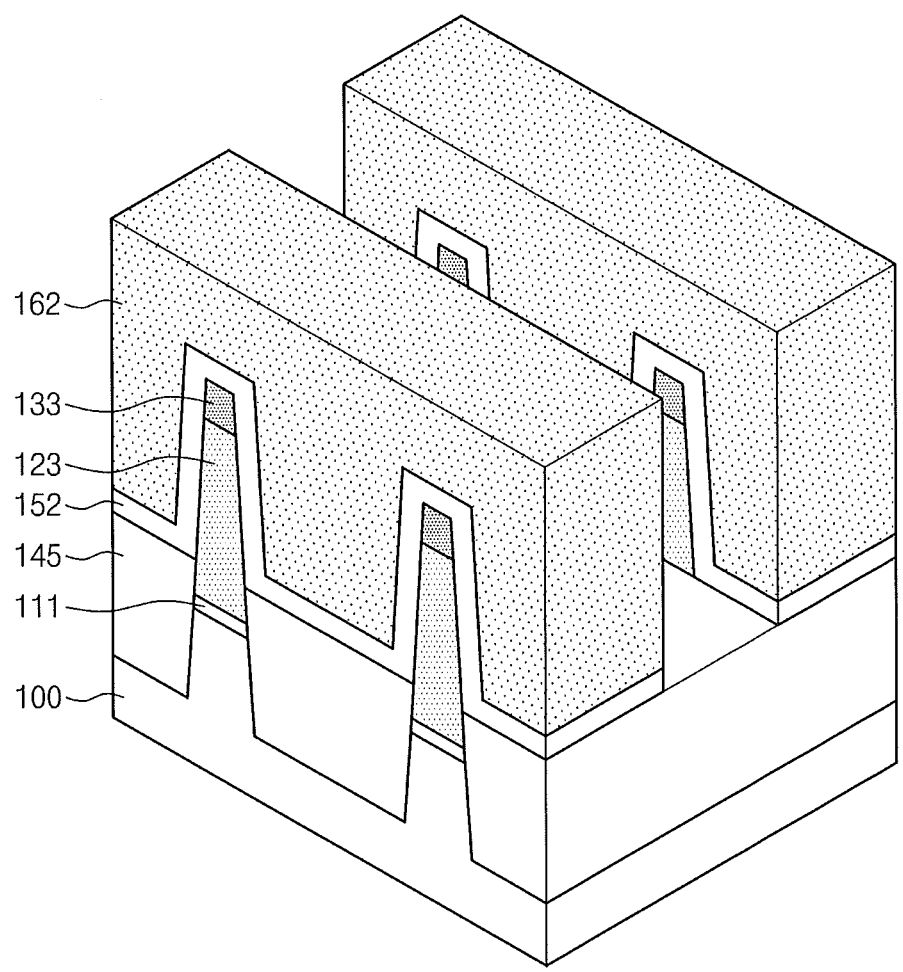

Referring to FIG. 8, the preliminary floating gate 121, the preliminary floating gate cap 131, the gate dielectric layer 150 and the second conducive layer 160 may be patterned. A floating gate 123, a floating gate cap 133, a gate dielectric pattern 152, and a control gate 162 may be formed by the patterning. Referring to FIGS. 1 and 2, an insulating spacer 181 may be formed on a sidewall of a recess region which is formed by the patterning. The insulating spacer 181 may include silicon nitride. An insulating layer 185 may be formed in the recess region. The insulating layer 185 may be a silicon oxide layer.

FIGS. 9 to 16 are perspective and sectional views illustrating a non-volatile memory device and a method of manufacturing the same according to a second embodiment of the inventive concept. The present embodiment is similar to the first embodiment with the exception of a difference in shape of the floating gate cap. Thus, description for technical features, which have been explained in the previous embodiment, will be omitted below for conciseness.

Figure 9:
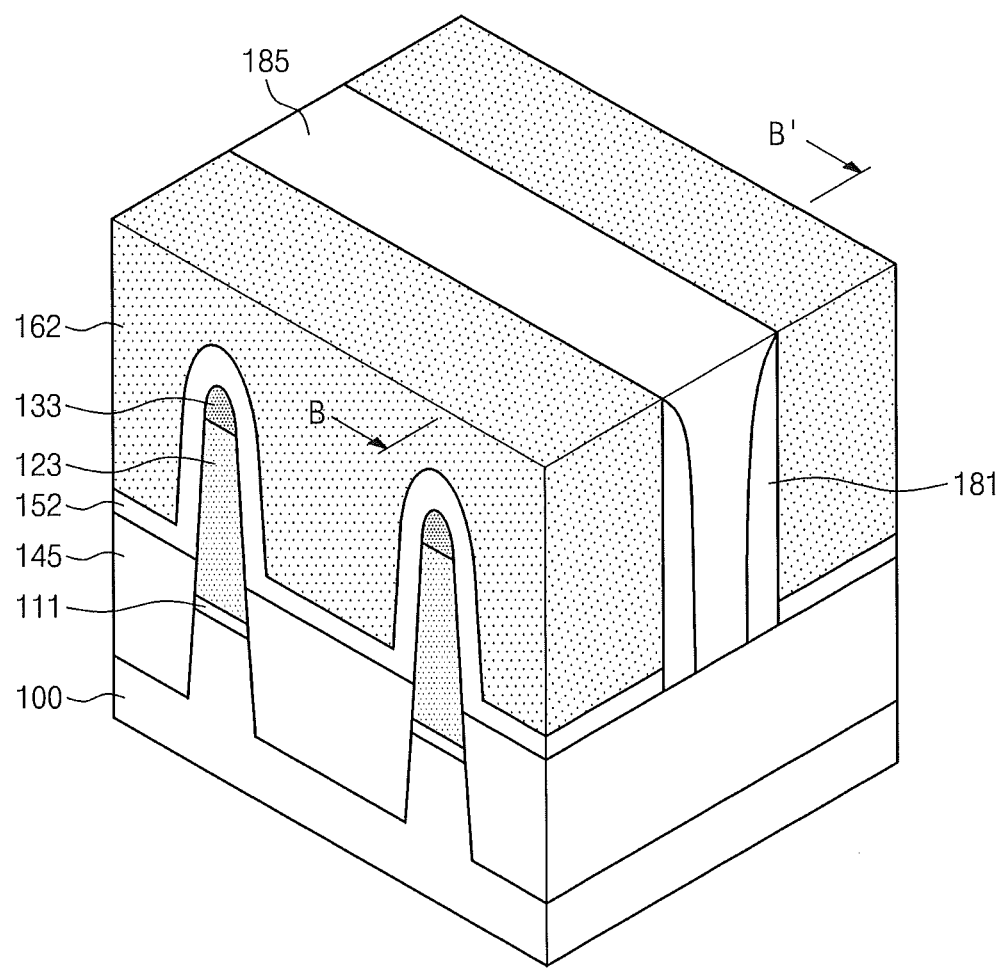
FIGS. 9 and 10 are perspective and sectional views illustrating a non-volatile memory device according to a second embodiment of the inventive concept.
Figure 10:
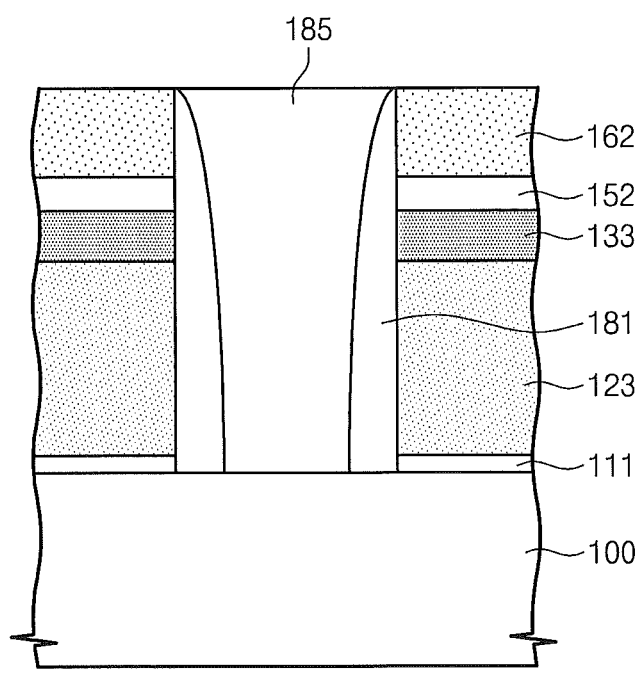

FIGS. 9 and 10 are perspective views and sectional views illustrating a non-volatile memory device according to a second embodiment of the inventive concept. FIG. 10 is a sectional view taken along line B-B' of FIG. 9.

Referring to FIGS. 9 and 10, a substrate 100 is provided where an active region is defined by device isolation layers 145. A gate structure may be provided on the substrate 100 where the active region is defined. The gate structure may include a tunnel insulating pattern 111, a floating gate 123, a gate dielectric pattern 152 and control gates 162, which are all stacked on the substrate 100 in sequence. The tunnel insulating pattern 111 may be provided on the surface of the active region of the substrate 100. The floating gate 123 may be provided at an intersection portion of the active region and the control gates 162. The gate dielectric pattern 152 and the control gates 162 may cross the active region on the floating gate 123. That is, the control gates 162 may extend across a channel length direction. While non-volatile memory devices program or erase data, charges are tunneled through the tunnel insulating pattern 111 by F-N tunneling to move to the substrate 100 or the floating gate 123. The control gates 162 may be disposed in parallel to each other, which are spaced apart by an insulating layer 185. A spacer 181 may be provided on a sidewall of the control gates 162.

The gate dielectric pattern 152 may insulate between the floating gate 123 and the control gates 162. The gate dielectric pattern 152 may be formed as a dielectric layer with a high dielectric constant. For example, the gate dielectric pattern 152 may have a stacked structure of a lower oxide layer/a nitride layer/an upper oxide layer so as to increase the dielectric constant. The lower and upper oxide layers may be metal oxides, such as $Al_2O_3$, $HfO_2$, $ZrO_2$, $La_2O_3$, $Ta_2O_3$, $TiO_2$, $SrTiO_3$ (STO) or $(Ba, Sr)TiO_3$ (BST). The nitride layer may be a silicon nitride layer ($Si_xN_y$, where x and y are positive integers).

A floating gate cap 133 may be provided between the floating gate 123 and the gate dielectric pattern 152. A lower surface of the floating gate cap 133 may contact an upper surface of the floating gate 123. The floating gate cap 133 may include a layer with a charge trap site. For example, the floating gate cap may include at least one of SiN, AlO, HfO, HfAlO and TaO. The floating gate cap 133 may include a charge trap site with density of $10^{18}$ cm$^3$ to $10^{19}$/cm$^3$. The floating gate cap 133 may include a material with a large band gap. The floating gate cap 133 may include a plurality of layers. For example, the floating gate cap 133 may include a charge trap layer and a silicon oxide layer. A width of the floating gate cap 133 in a channel width direction may be less than that of the floating gate 123.

According to a second embodiment of the inventive concept, on a cross-section of the floating gate cap 133 taken along a channel width direction, a center portion may be higher than an edge portion thereof. For example, the cross-section of the floating gate cap 133 taken along a channel width direction may have a rounded shape of a top corner.

Recently, according to a decrease in design rule the upper surface of the floating gate tends to be narrower. Thus, an electric field caused by the control gate concentrates on the upper surface of the floating gate 123, increasing leakage current. Non-volatile memory devices according to a second embodiment of the inventive concept may reduce phenomenon of electric field concentration on the upper surface of the floating gate 123 because a floating gate cap 133 with a charge trap site is provided. That is, charges may be stored into or removed from the floating gate cap 133 with a charge trap site together with the floating gate 123. Charges trapped in the floating gate cap 133, compared to charges stored in the floating gate 123, are localized charges which are not easy to move. Thus, charges trapped in the floating gate cap 133 are less leaked into the gate dielectric pattern 152. Furthermore, an upper portion of the floating gate 123 may be spaced apart from the control gates 162 by the floating gate cap 133 to thereby reduce leakage current. Charges stored into the gate dielectric pattern 152 may be decreased because the leakage current into the gate dielectric pattern 152 is decreased by the floating gate cap 133. Thus, endurance may be improved.

FIGS. 11 to 16 are perspective views illustrating a method of manufacturing a non-volatile memory device according to the second embodiment of the inventive concept.

Figure 11:
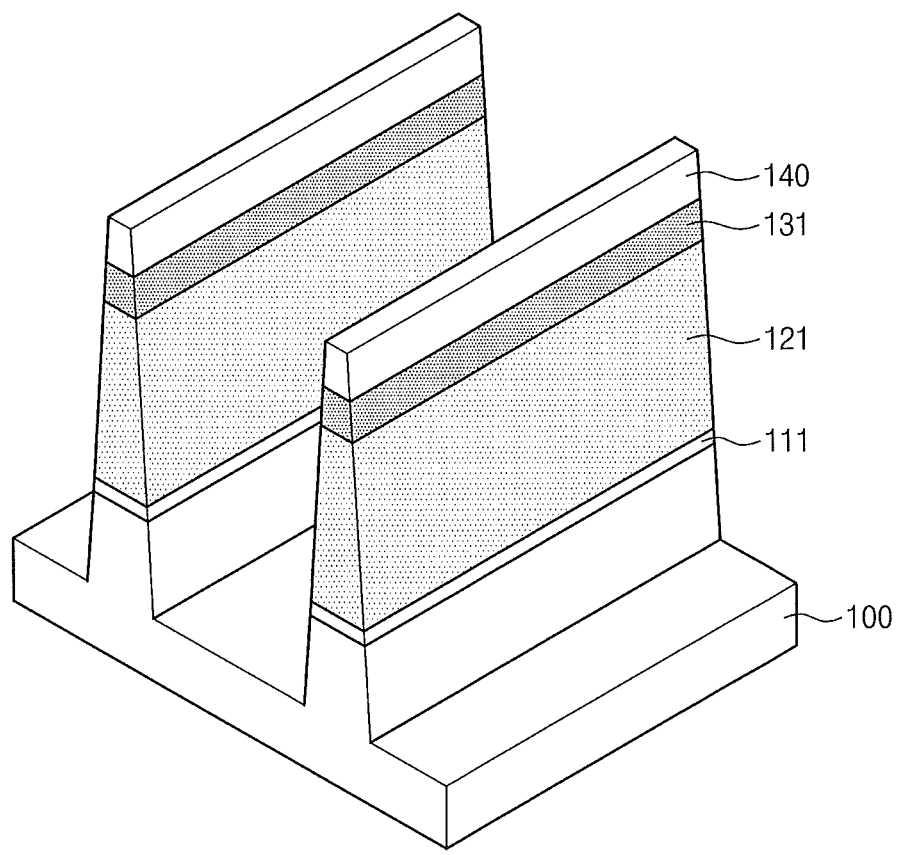
FIGS. 11 to 16 are perspective views illustrating a method of manufacturing the non-volatile memory device according to the second embodiment of the inventive concept.

Referring to FIG. 11, a tunnel insulating pattern 111, a preliminary floating gate 121 and a preliminary floating gate cap 131 are formed on a substrate 100. The tunnel insulating pattern 111, the preliminary floating gate 121 and the preliminary floating gate cap 130 may be formed by patterning the tunnel insulating layer 110, the first conducive layer 120 and the floating gate cap 130, as set forth in FIG. 3. The patterning may be performed using a mask pattern 140 as an etch mask. The floating gate cap layer 131 may include a layer having a charge trap site. For example, the floating gate cap layer 131 may include at least one of the materials SiN, AlO, HfO, HfAlO and TaO. The floating gate cap layer 131 may include a material with a large band gap. The floating gate cap 131 may include a plurality of layers. For example, the floating gate cap 131 may include a charge trap layer and a silicon oxide layer.

Figure 12:
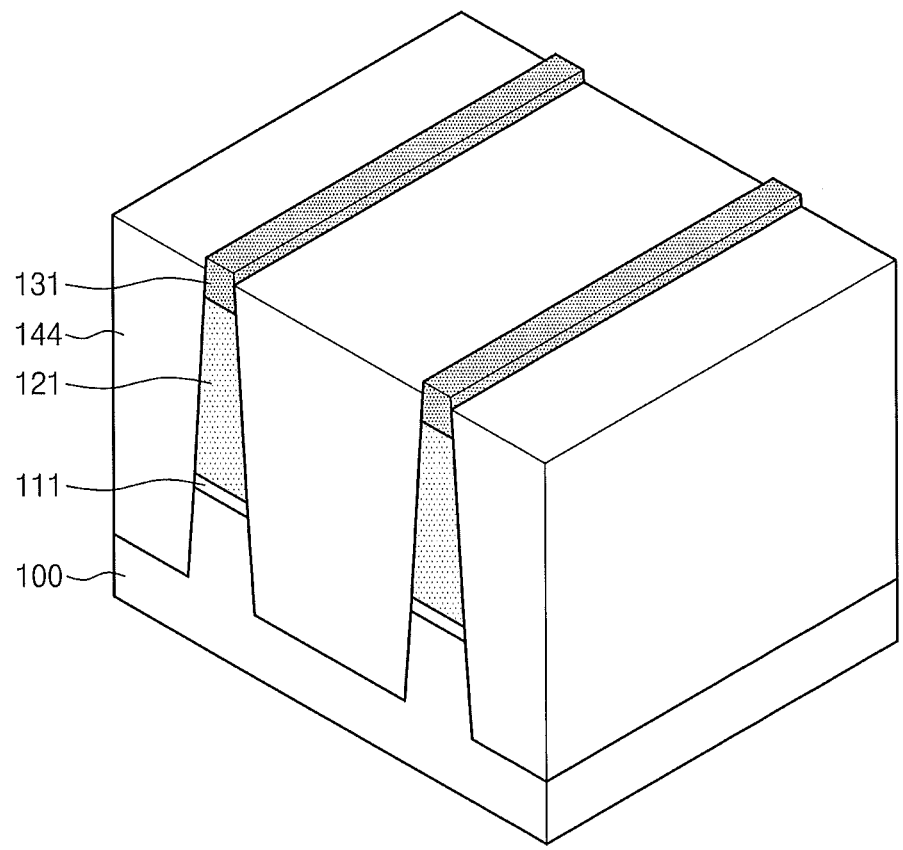

Referring to FIG. 12, preliminary device isolation layers 144 may be formed in a recess region by the patterning. The preliminary device isolation layers 144 may define an active region. The preliminary device isolation layers 144 may be an undoped silicate glass (USG) oxide layer, a tetra-ethyl-orthosilicate (TEOS) oxide layer or a high density plasma (HDP) oxide layer. The preliminary device isolation layers 144 may be formed in such a way that an insulating layer (not shown) is conformally formed on the substrate 100 and then the insulating layer is planarized until the preliminary floating gate cap 131 is exposed.

Figure 13:
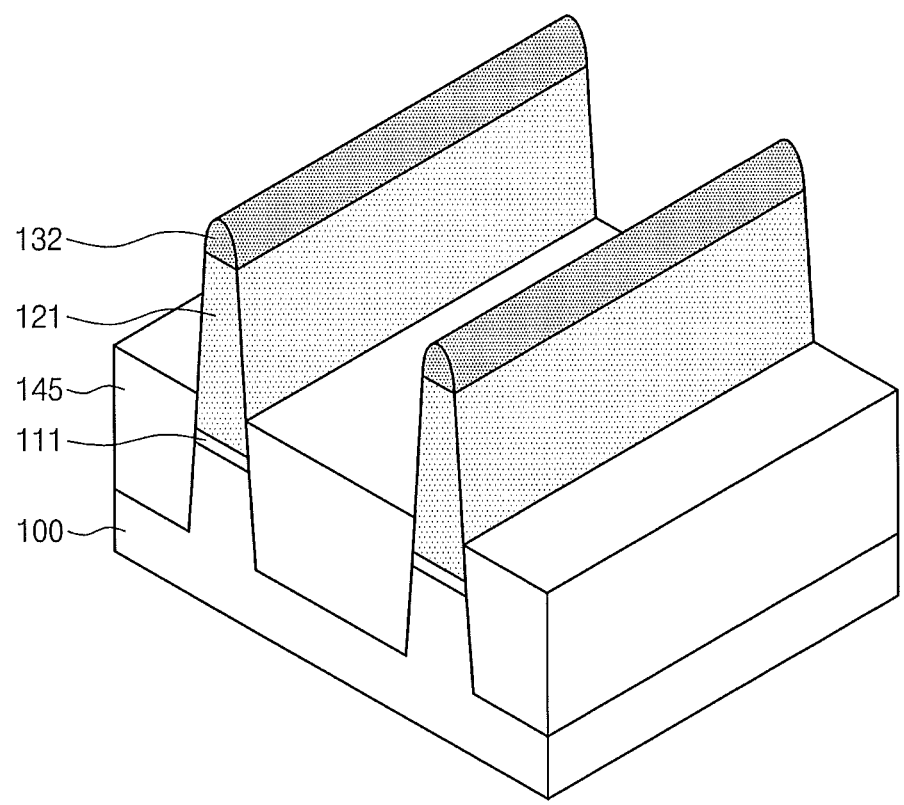

Referring to FIG. 13, a rounded preliminary floating gate cap 132, which is rounded by making round an upper portion of the preliminary floating gate cap 131, is formed. The rounded preliminary floating gate cap 132 may be formed by thermally treating or wet etching the upper portion of the exposed preliminary floating gate cap 131. After forming the rounded preliminary floating gate cap 132, device isolation layers 145 may be formed by etching the preliminary device isolation layers 144 so as to partially expose a sidewall of preliminary floating gate 121.

Figure 14:
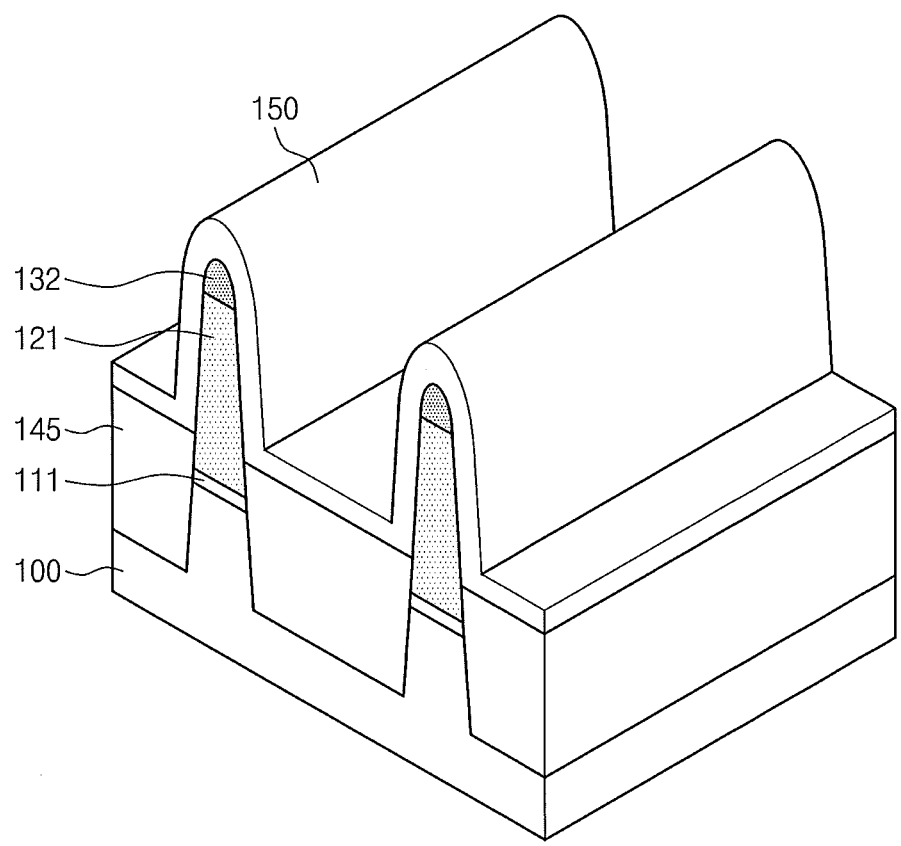

Referring to FIG. 14, a gate dielectric layer 150 may be formed on the device isolation layers 145, the preliminary floating gate 121, and the rounded preliminary floating gate cap 132. The gate dielectric layer 150 may be formed of thermal oxides. The gate dielectric layer 150 may be formed of high dielectric materials, such as $Al_2O_3$, $HfO_2$, $ZrO_2$, $La_2O_3$, $Ta_2O_3$, $TiO_2$, $SrTiO_3$ (STO) or $(Ba, Sr)TiO_3$ (BST) or a combination thereof. Furthermore, the gate dielectric layer 150 may be formed by stacking a silicon oxide layer, a silicon nitride layer and a silicon oxide layer in sequence.

Figure 15:
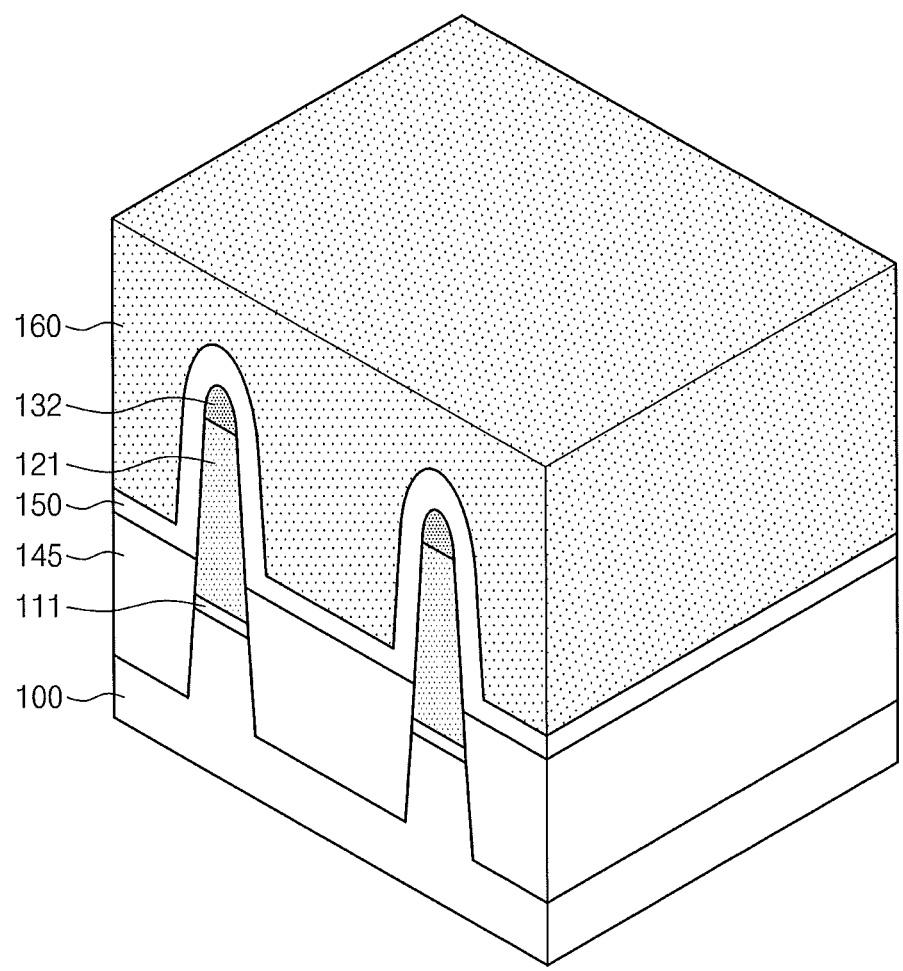

Referring to FIG. 15, a second conductive layer 160 may be formed on the gate dielectric layer 150. The second conductive layer 160 may be formed by depositing a doped polysilicon layer or a doped polycide layer on the gate dielectric layer 150.

Figure 16:
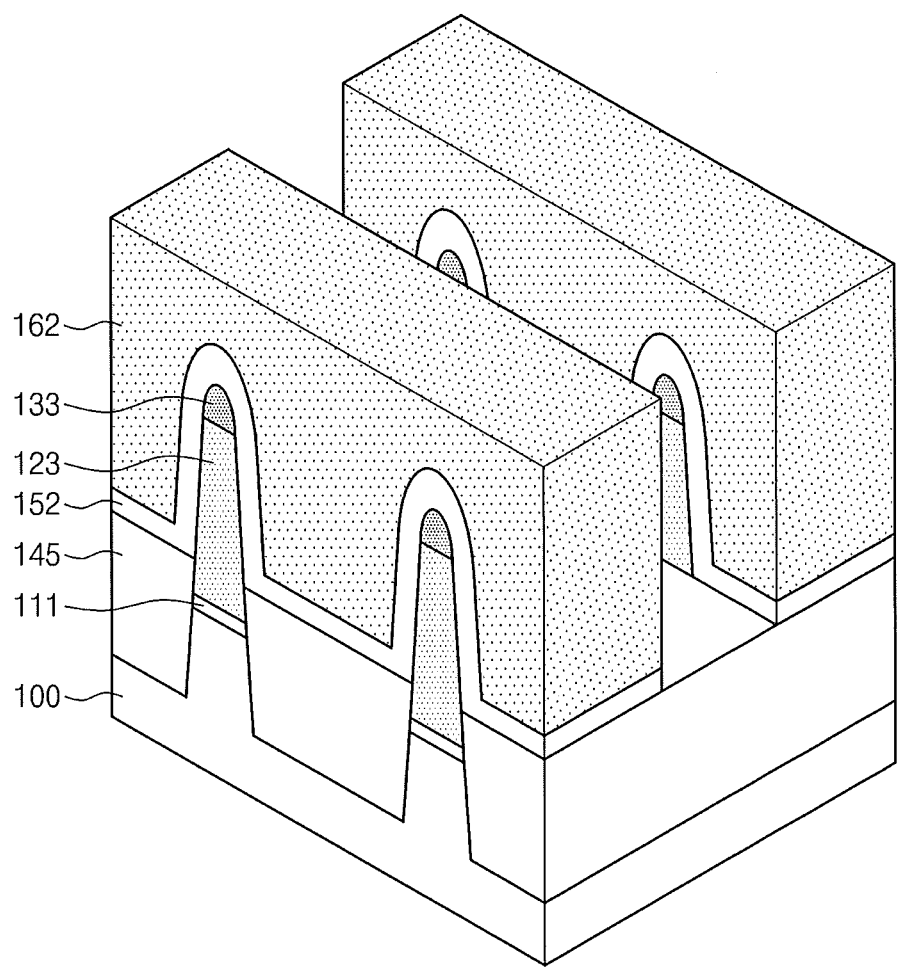

Referring to FIG. 16, the preliminary floating gate 121, the rounded preliminary floating gate cap 132, the gate dielectric layer 150, and the second conductive layer 160 may be patterned. A floating gate 123, a floating gate cap 133, a gate dielectric pattern 152, and a control gate 162 may be formed by the patterning. Referring to FIGS. 9 and 10, an insulating spacer 181 may be formed on a sidewall of a recess region, which is formed by the patterning. The insulating spacer 181 may include silicon nitride. An insulating layer may be formed in the recess region. The insulating layer may be a silicon oxide layer.

FIGS. 17 to 23 are perspective and sectional views illustrating a non-volatile memory device and a method of manufacturing the same according to a third embodiment of the inventive concept. The present embodiment is similar to the first embodiment, with the exception of a difference in shape of the floating gate, the floating gate cap and the gate dielectric pattern. Thus, a description for technical features, which have been explained in the previous embodiments, will be omitted below for conciseness.

Figure 17:
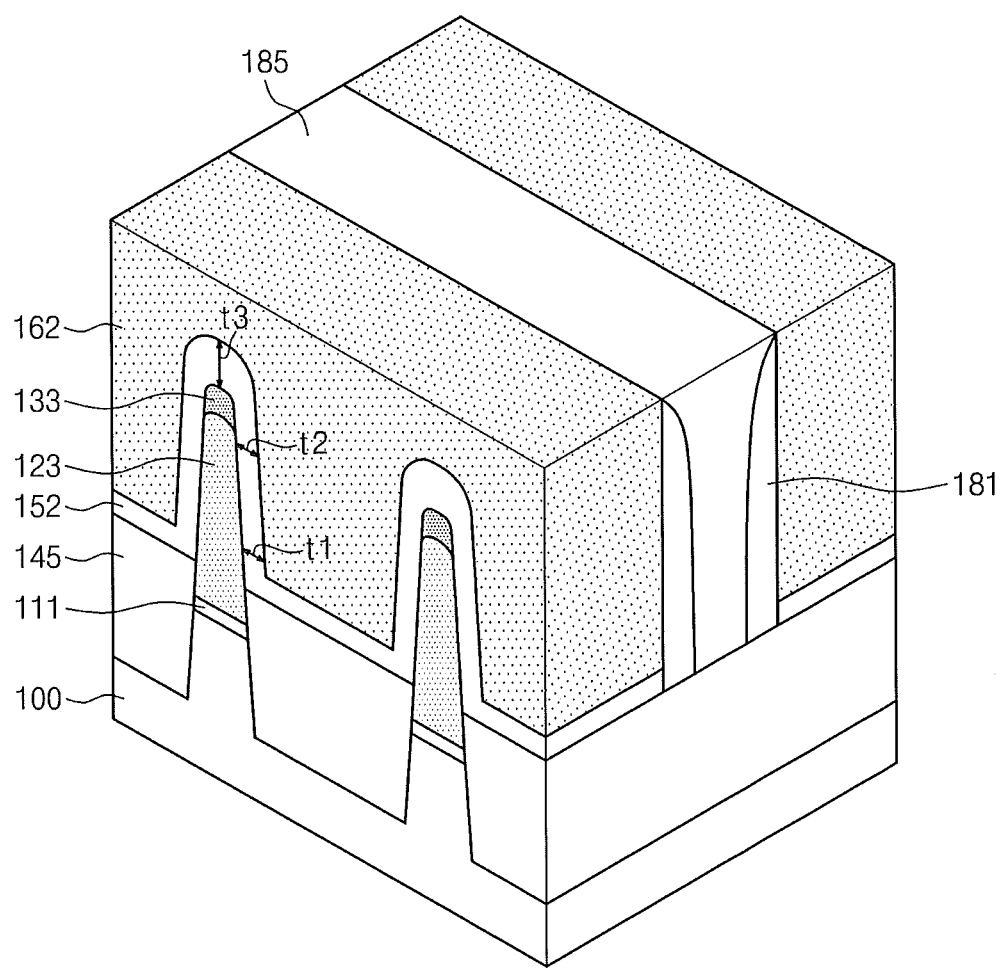
FIG. 17 is a perspective view illustrating a non-volatile memory device according to a third embodiment of the inventive concept.

FIG. 17 is a figure illustrating a non-volatile memory device according to the third embodiment of the inventive concept. Referring to FIG. 17, a substrate 100 is provided in which an active region is defined by device isolation layers 145. A gate structure is provided on the substrate 100 where an active region is defined. The gate structure may include a tunnel insulating pattern 111, a floating gate 123, a gate dielectric pattern 152, and control gates 162, which are all stacked on the substrate 100 in sequence. The tunnel insulating pattern 111 may be provided on the active region surface of the substrate 100. The floating gate 123 may be provided at an intersection portion of the active region and the control gates 162. The gate dielectric pattern 152 and the control gates 162 may be disposed to the active region over the floating gate 123. That is, the control gates 162 may extend across a channel length direction. While non-volatile memory devices program or erase data, charges are tunneled through the tunnel insulating pattern 111 by F-N tunneling to move to the substrate 100 or the floating gate 123. The control gates 162 may be disposed in parallel to each other, which are spaced apart by an insulating layer 185. A spacer 181 may be provided on sidewalls of the control gates 162.

A floating gate cap 133 may be provided between the floating gate 123 and the gate dielectric pattern 152. A lower surface of the floating gate cap 133 may contact an upper surface of the floating gate 123. The floating gate cap 133 may include a layer with a charge trap site. For example, the floating gate cap may include at least one of the materials SiN, AlO, HfO, HfAlO and TaO. The floating gate cap 133 may include a charge trap site with density of $10^{18}/cm^3$ to $10^{19}/cm^3$. The floating gate cap 133 may include a material with a large band gap. The floating gate cap 133 may include a plurality of layers. For example, the floating gate cap 133 may include a charge trap layer and a silicon oxide layer. A width of the floating gate cap 133 in a channel width direction may be less than that of the floating gate 123.

Recently, according to a decrease in design rule the upper surface of the floating gate tends to be narrower. Thus, an electric field caused by the control gate concentrates on the upper surface of the floating gate 123, increasing leakage current. Non-volatile memory devices according to the third embodiment of the inventive concept may reduce phenomenon of electric field concentration on the upper surface of the floating gate 123. That is, charges may be stored into or removed from the floating gate cap 133 with a charge trap site together with the floating gate 123. Charges trapped in the floating gate cap 133, compared to charges stored in the floating gate 123, are localized charges, which are not easy to move. Thus, charges trapped in the floating gate cap 133 are less likely to be leaked into the gate dielectric pattern 152. Furthermore, an upper portion of the floating gate 123 may be spaced apart by the floating gate cap 133 from the control gates 162 to thereby reduce leakage current. Charges stored into the gate dielectric pattern 152 may be decreased because the leakage current into the gate dielectric pattern 152 is decreased by the floating gate cap 133. Thus, endurance may be improved.

A cross-section of the floating gate 123 taken along a channel width direction may have a rounded shape of an upper corner. Leakage current may be decreased because an electric field concentration on the corner is decreased by the rounded shape. The gate dielectric pattern 152 may insulate between the floating gate 123 and the control gates 162. The gate dielectric pattern 152 may be formed of a dielectric layer with a high dielectric constant. For example, the gate dielectric pattern 152 may have a stacked structure of a lower oxide layer/a nitride layer/an upper oxide layer so as to increase the dielectric constant. The lower and upper oxide layers may be formed of metal oxides such as $Al_2O_3$, $HfO_2$, $ZrO_2$, $La_2O_3$, $Ta_2O_3$, $TiO_2$, $SrTiO_3$ (STO) or (Ba, Sr)$TiO_3$ (BST). The nitride layer may be a silicon nitride layer ($Si_xN_y$, where x and y are positive integers). An upper thickness (t3) of the gate dielectric pattern 152 on the floating gate cap 133 may be thicker than a sidewall thickness (t1, t2) of the gate dielectric pattern 152 on the sidewall of the floating gate 123. When the upper thickness is thicker, leakage current may be decreased.

FIGS. 18 to 23 are perspective views illustrating a method of manufacturing a non-volatile memory device according to a third embodiment of the inventive concept.

Figure 18:
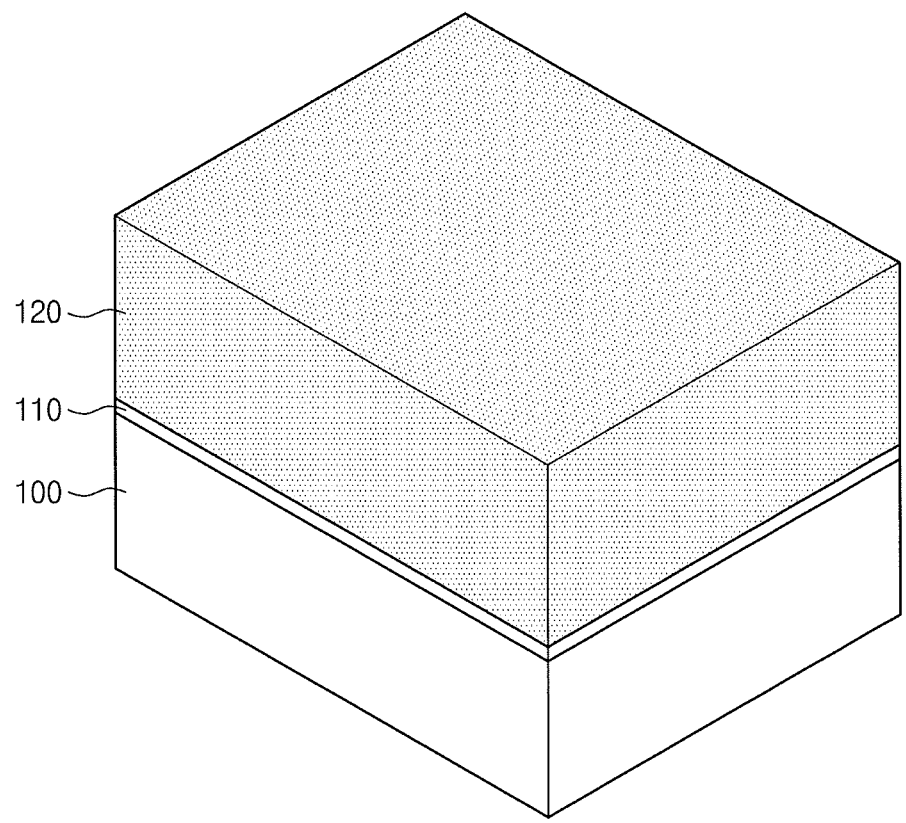
FIGS. 18 to 23 are perspective views illustrating a method of manufacturing the non-volatile memory device according to the third embodiment of the inventive concept.

Referring to FIG. 18, a tunnel insulating layer 100 may be formed on a substrate 100. The substrate 100 may be a bulk silicon substrate, a silicon on insulator (SOI) substrate, a germanium substrate, a germanium on insulator (GOI) substrate, a silicon-germanium substrate or an epitaxial thin-film substrate, which is obtained by performing a selective epitaxial growth. The tunnel insulating layer 110 may be a silicon oxide layer which is formed by a thermal oxidation process. The tunnel insulating layer 110 may be formed of high dielectric materials, such as $Al_2O_3$, $HfO_2$, $ZrO_2$, $La_2O_3$, $Ta_2O_3$, $TiO_2$, $SrTiO_3$ (STO) or (Ba, Sr)$TiO_3$ (BST) or a combination thereof. The tunnel insulating layer 110 may be formed by chemical vapor deposition (CVD) or atomic layer deposition (ALD). A first conductive layer 120 may be formed on the tunnel insulating layer 110. The first conductive layer 120 may be an impurity-doped polysilicon layer. The first conductive layer 120 may be formed by CVD.

Figure 19:
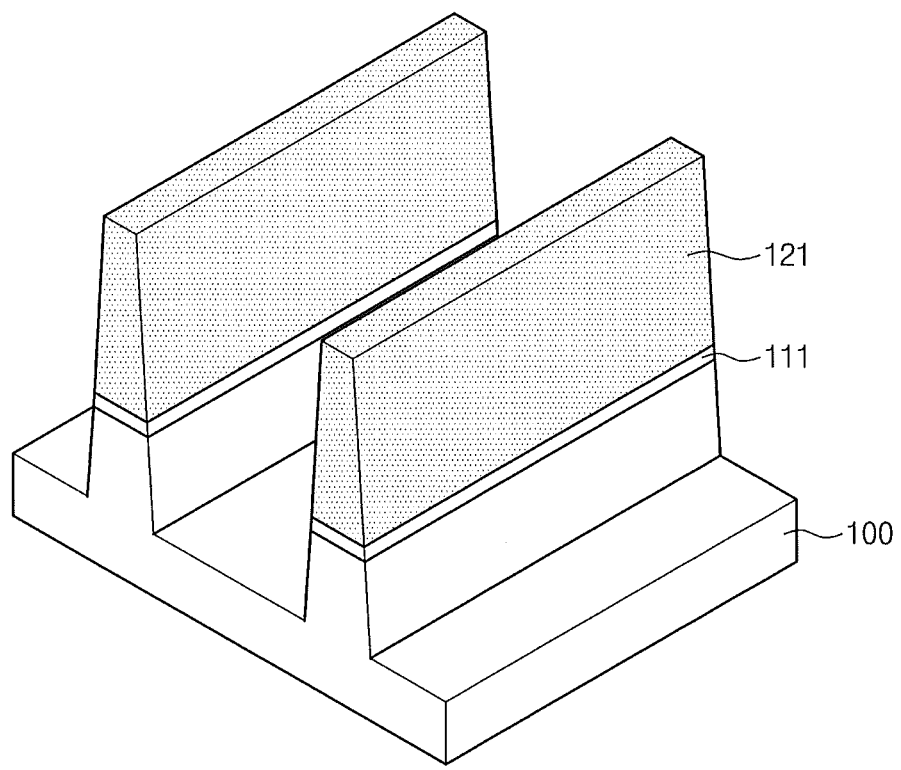

Referring to FIG. 19, the substrate 100, the tunnel insulating layer 110 and the first conductive layer 120 are patterned. By the patterning, a tunnel insulating pattern 111 and a preliminary floating gate 121 may be formed. The patterning may be performed, using a mask pattern as an etch mask.

Figure 20:
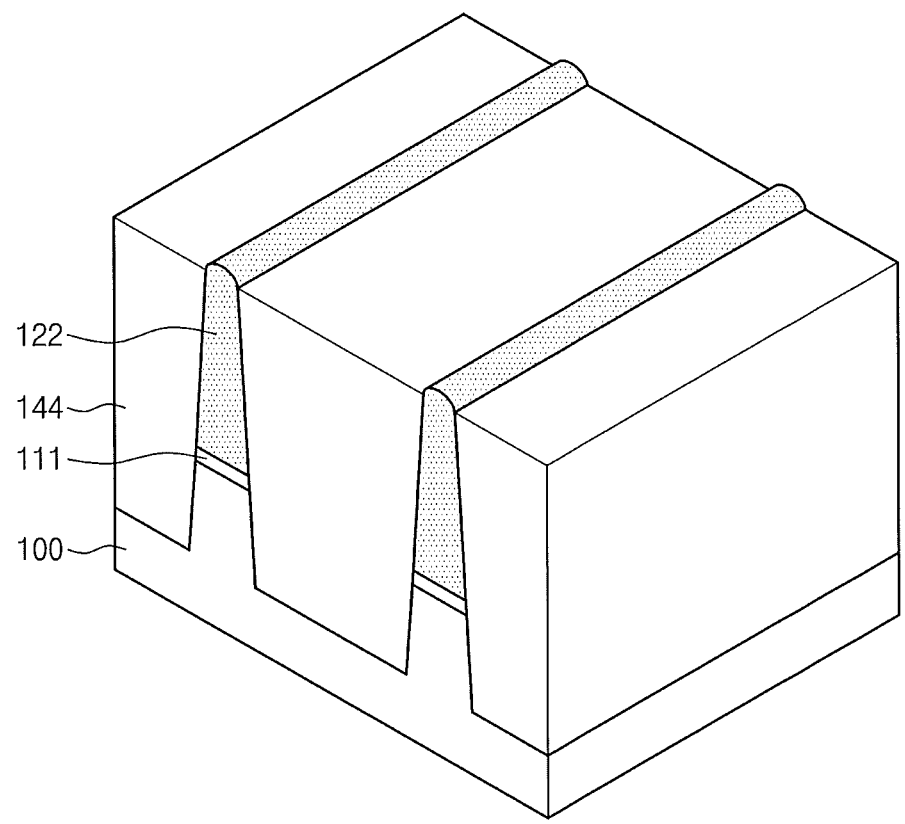

Referring to FIG. 20, preliminary device isolation layers 144 may be formed in a recess region by the patterning. The preliminary device isolation layers 144 may define an active region. The preliminary device isolation layers 144 may be an undoped silicate glass (USG) oxide layer, a tetra-ethyl-orthosilicate (TEOS) oxide layer or a high density plasma (HDP) oxide layer. The preliminary device isolation layers 144 may be formed in such a way that an insulating layer (not shown) is conformally formed on the substrate 100 and then the insulating layer is planarized until the preliminary floating gate cap 131 is exposed. A rounded preliminary floating gate 122 which is rounded by making round an upper portion of the preliminary floating gate 121 is formed. The rounded preliminary floating gate 122 may be formed by thermally treating or wet etching the upper portion of the exposed preliminary floating gate 121.

Figure 21:
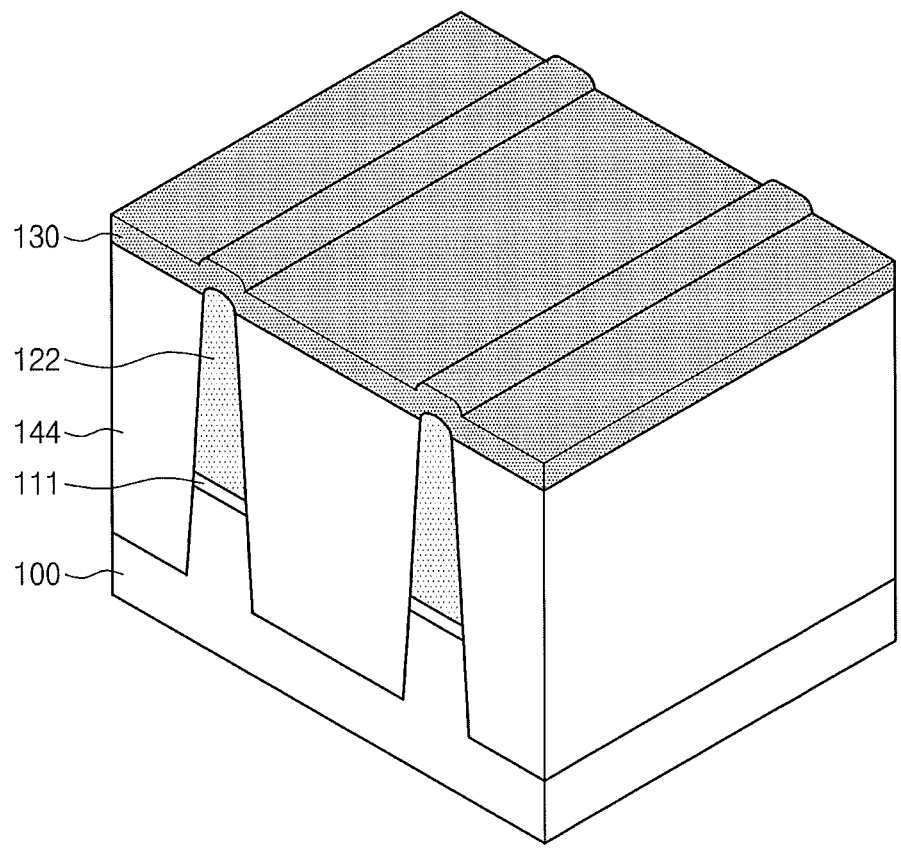

Referring to FIG. 21, a floating gate cap layer 130 may be formed on the rounded preliminary floating gate 122 and the preliminary device isolation layers 144. The floating gate cap layer 130 may include a layer with a charge trap site. For example, the floating gate cap may include at least one of the materials SiN, AlO, HfO, HfAlO and TaO. The floating gate cap layer 130 may include a material with a large band gap. The floating gate cap layer 130 may include a plurality of layers. For example, the floating gate cap layer 130 may include a charge trap layer and a silicon oxide layer. The floating gate cap layer 130 may be formed by CVD or ALD.

Figure 22:
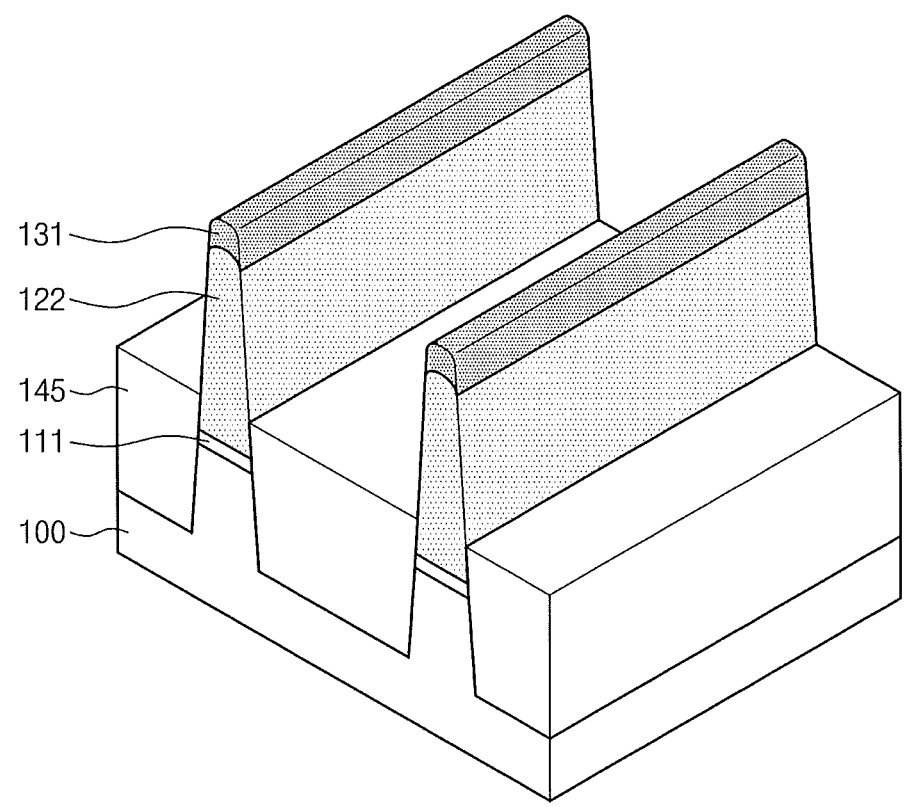

Referring to FIG. 22, a preliminary floating gate cap 131 and device isolation layers 145 may be formed by patterning the floating gate cap layer 130 and the preliminary device isolation layers 144. The preliminary floating gate cap 131, which is formed on the rounded preliminary floating gate 122, may have a rounded shape of an upper portion. The device isolation layers 145 may be formed so as to partially expose a sidewall of preliminary floating gate 122.

Figure 23:
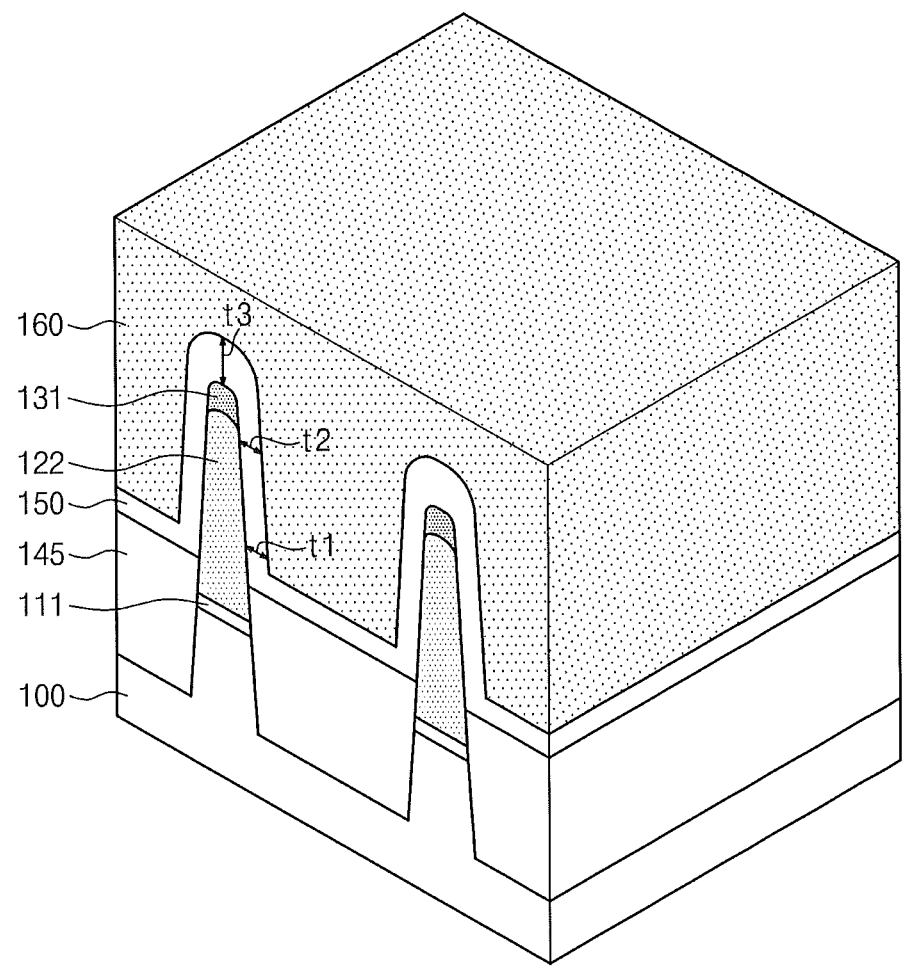

Referring to FIG. 23, a gate dielectric layer 150 may be formed on the device isolation layers 145, the rounded preliminary floating gate 122 and the preliminary floating gate cap 131. The gate dielectric layer 150 may be formed of thermal oxides. The gate dielectric layer 150 may be formed of high dielectric materials, such as $Al_2O_3$, $HfO_2$, $ZrO_2$, $La_2O_3$, $Ta_2O_3$, $TiO_2$, $SrTiO_3$ (STO) or (Ba, Sr)$TiO_3$ (BST) or a combination thereof. Furthermore, the gate dielectric layer 150 may be formed by stacking a silicon oxide layer, a silicon nitride layer, and a silicon oxide layer in sequence. An upper thickness (t3) of the gate dielectric pattern 152 on the preliminary floating gate cap 131 may be thicker than a sidewall thickness (t1, t2) of the gate dielectric pattern 152 on the sidewall of the preliminary floating gate 122. For example, the gate dielectric pattern 152 may be disposed by CVD with a lower conformality compared to a typical deposition process. A second conductive layer 160 may be formed on the gate dielectric layer 150. The second conductive layer 160 may be formed by depositing a doped polysilicon layer or a doped polycide layer on the gate dielectric layer 150.

Referring to FIG. 17, the rounded preliminary floating gate 122, the preliminary floating gate cap 131, the gate dielectric layer 150, and the second conductive layer 160 may be patterned. A floating gate 123, a floating gate cap 133, a gate dielectric pattern 152, and a control gate 162 may be formed by the patterning. An insulating spacer 181 may be formed on sidewalls of a recess region, which is formed by the patterning. The insulating spacer 181 may include a silicon nitride. An insulating layer 185 may be formed in the recess region. The insulating layer 185 may be a silicon oxide layer.

Figure 24:
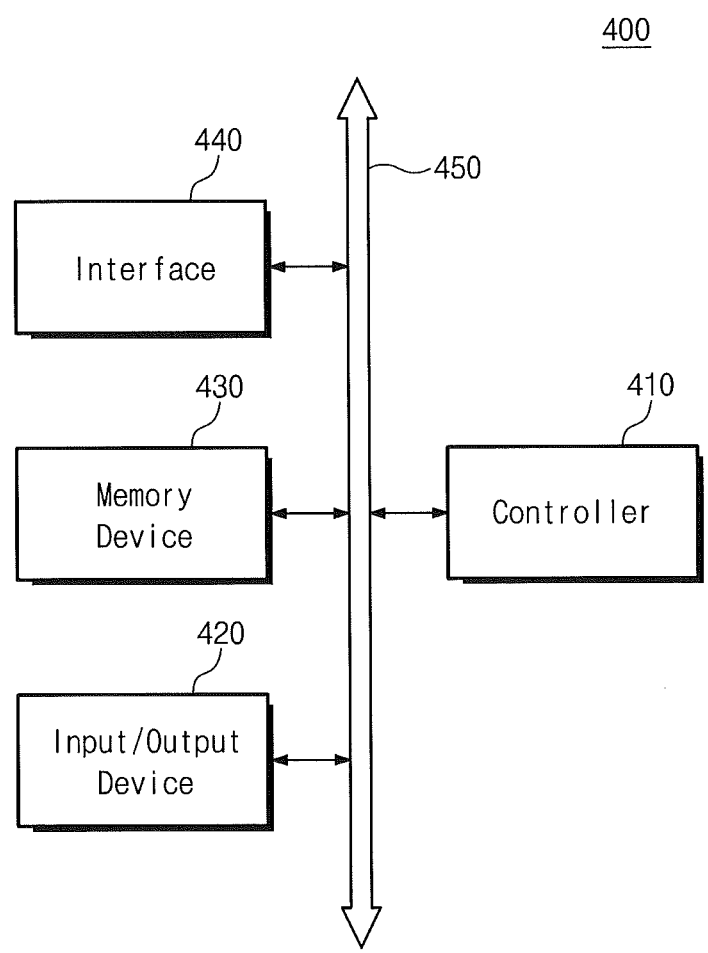
FIG. 24 is a block diagram illustrating an electronic system according to embodiments of the inventive concept.

FIG. 24 is a block diagram illustrating an electronic system, which includes a non-volatile memory device according to an embodiment of the inventive concept.

Referring to FIG. 24, an electronic system 400 may include a controller 410, an input/output device 420 and a memory device 430. The controller 410, the input/output device 420, and the memory device 430 are interconnected to each other through a bus 450. The bus 450 is a path for data to move along. The controller 410 may include at least one of at least one microprocessor, a digital signal processor, a microcontroller, and logic elements with similar functions thereto. The input/output device 420 may include at least one of a keypad, a keyboard and a display device. The memory device 430 is a device to store data. The memory device 430 may store user data and/or commands executed by the controller 410. The memory device 430 may include at least one of the non-volatile memory devices, which have been described in the previous embodiments. The electronic system 400 may further include an interface 440 to transfer data to a communication network or receive data from the communication network. The interface 440 may be either wired or wireless. For example, the interface 440 may include an antenna or a wired/wireless transceiver.

The electronic system 400 may be realized as a mobile system, a personal computer, an industrial computer, or other systems capable of performing various functions. For example, the mobile system may be a personal digital assistant (PDA), a portable computer, a web tablet, a mobile phone, a wireless telephone, a laptop computer, a memory card, a digital music system or a system for transmitting/receiving information. In the case where the electronic system 400 can perform wireless communication, the electronic system 400 is applicable to a communication interface protocol such as a third-generation communication system, e.g., CDMA, GSM, NADC, E-TDMA, WCDAM and CDMA1000.

Hereinafter, a memory card including the non-volatile memory device according to the embodiment of the inventive concept will be described in detail with reference to the accompanying drawings.

Figure 25:
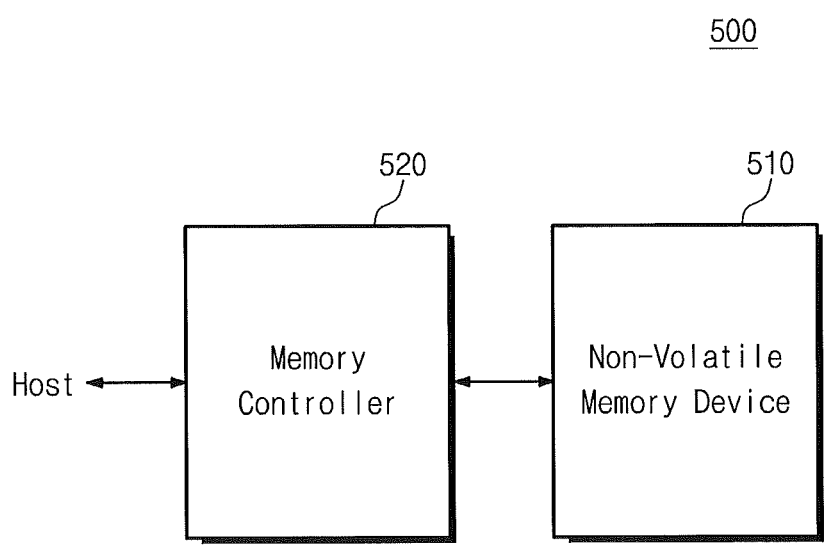
FIG. 25 is a block diagram illustrating a memory card according to embodiments of the inventive concept.

FIG. 25 is a block diagram illustrating a memory card, which includes a non-volatile memory device according to some embodiments of the inventive concept.

Referring to FIG. 25, a memory card 500 includes a non-volatile memory device 510 and a memory controller 520. The non-volatile memory device 510 may store data or read stored data. The non-volatile memory device 510 may include at least one of the non-volatile memory devices, which have been described in the previous embodiments. The memory controller 520 controls the non-volatile memory device 520 to read stored data or write data in response to read/write requests from a host.

As described above, according to embodiments of the inventive concept, a floating gate cap is provided between a floating gate and a gate insulating layer to thereby reduce leakage current due to electric field concentration. Endurance may also be improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

That which is claimed:

1. A non-volatile memory device comprising:
   a tunnel insulating pattern on a substrate;
   a floating gate on the tunnel insulating pattern;
   a floating gate cap on the floating gate, and having a charge trap site;
   a gate dielectric pattern on the floating gate cap; and
   a control gate on the gate dielectric pattern;
   wherein the gate dielectric pattern on a top surface of the floating gate cap is thicker than the gate dielectric pattern on a sidewall of the floating gate;
   wherein a cross-section of the floating gate has a rounded shape at a top corner thereof; and
   wherein the cross-section of the floating gate cap has a rounded shape at a top corner thereof.

2. The non-volatile memory device of claim 1, wherein the floating gate cap comprises at least one of SiN, AlO, HfO, HfAlO and TaO.

3. The non-volatile memory device of claim 1, wherein, on a cross-section of the floating gate cap, a center portion is higher than an edge portion thereof.

4. The non-volatile memory device of claim 1, wherein the control gate extends in a cross-direction of a channel length.

5. The non-volatile memory device of claim 1, wherein the floating gate cap comprises a charge trap layer and a silicon oxide layer.

6. The non-volatile memory device of claim 1, wherein a width of the floating gate cap in a channel width direction is smaller than a width of the floating gate.

* * * * *